US009634192B2

(12) United States Patent
Moon et al.

(10) Patent No.: US 9,634,192 B2
(45) Date of Patent: Apr. 25, 2017

(54) LIGHT EMITTING DEVICE AND LIGHTING SYSTEM

(71) Applicant: LG INNOTEK CO., LTD., Seoul (KR)

(72) Inventors: Ji Hyung Moon, Seoul (KR); Myeong Soo Kim, Seoul (KR); Chung Song Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/661,115

(22) Filed: Mar. 18, 2015

(65) Prior Publication Data
US 2016/0043280 A1 Feb. 11, 2016

(30) Foreign Application Priority Data

Aug. 7, 2014 (KR) .................. 10-2014-0101488

(51) Int. Cl.
H01L 33/38 (2010.01)
H01L 33/44 (2010.01)
H01L 33/40 (2010.01)

(52) U.S. Cl.
CPC ............ *H01L 33/387* (2013.01); *H01L 33/38* (2013.01); *H01L 33/44* (2013.01); *H01L 33/382* (2013.01); *H01L 33/405* (2013.01)

(58) Field of Classification Search
CPC ....... H01L 33/387; H01L 33/38; H01L 33/44; H01L 33/382; H01L 33/405;
(Continued)

(56) References Cited

U.S. PATENT DOCUMENTS

2004/0012030 A1 1/2004 Chen et al.
2009/0039374 A1 2/2009 Yahata et al.
(Continued)

FOREIGN PATENT DOCUMENTS

KR 10-2009-0062619 6/2009
KR 10-2011-0134881 12/2011
(Continued)

OTHER PUBLICATIONS

European Search Report dated Dec. 14, 2015 issued in Application No. 15175955.2.

*Primary Examiner* — Julio J Maldonado
*Assistant Examiner* — Stanetta Isaac
(74) *Attorney, Agent, or Firm* — Ked & Associates, LLP

(57) ABSTRACT

Disclosed are a light emitting device, a method of fabricating the same, a light emitting device package, and a lighting system. The light emitting device may include a substrate, a first conductive semiconductor layer on the substrate, an active layer on the first conductive semiconductor layer, a second conductive semiconductor layer on the active layer, an ohmic layer on the second conductive semiconductor layer, an insulating layer on the ohmic layer, a first branch electrode electrically connected with the first conductive semiconductor layer, a first pad electrode connected with the first branch electrode for electrical connection with the first conductive semiconductor layer, a second pad electrode in contact with the ohmic layer through the insulating layer, a second branch electrode connected with the second pad electrode on the insulating layer, and a second through electrode passing through the insulating layer to connect the second branch electrode with the ohmic layer.

20 Claims, 6 Drawing Sheets

(58) Field of Classification Search
CPC . H01L 257/97; H01L 33/0016; H01L 33/002; H01L 33/08; H01L 257/99; H01L 33/36; H01L 33/48; H01L 25/048; H01L 51/50; H01L 2227/32; H01L 257/88

See application file for complete search history.

(56) References Cited

U.S. PATENT DOCUMENTS

| | | | |
|---|---|---|---|
| 2011/0049537 A1* | 3/2011 | Lee | H01L 25/0753 257/88 |
| 2013/0032847 A1 | 2/2013 | Chuang et al. | |
| 2013/0234192 A1 | 9/2013 | Kim et al. | |
| 2014/0042484 A1 | 2/2014 | Schubert | |

FOREIGN PATENT DOCUMENTS

| | | |
|---|---|---|
| KR | 10-2012-0053990 | 5/2012 |
| KR | 10-2014-0034464 | 3/2014 |
| KR | 10-2014-0062945 | 5/2014 |

\* cited by examiner

LIGHT EMITTING DEVICE AND LIGHTING SYSTEM

CROSS-REFERENCE TO RELATED APPLICATION

This application claims priority under 35 U.S.C. §119 to Korean Patent Application No. 10-2014-0101488 filed Aug. 7, 2014, which is hereby incorporated by reference in its entirety.

BACKGROUND

1. Field

The embodiments relate to a light emitting device, a method of fabricating the same, a light emitting device package, and a lighting system.

2. Background

Generally, a light emitting device (LED) includes a p-n junction diode having a characteristic of converting electric energy into light energy. The p-n junction diode can be formed by combining group III-V compound semiconductors on the periodic table. The light emitting device can represent various colors by adjusting the compositional ratio of the compound semiconductors.

When a forward voltage is applied to an LED, electrons at an n layer are combined with holes at a p layer, so that energy corresponding to an energy gap between a conduction band and a valance band may be emitted. This energy is mainly emitted in the form of heat or light. The LED emits the energy in the form of light.

For instance, a nitride semiconductor has been spotlighted in the development field of optical devices and high-power electronic devices due to superior thermal stability and wide band gap energy thereof. In particular, blue, green, and UV light emitting devices employing the nitride semiconductor have already been commercialized and extensively used.

A lateral-type light emitting device among light emitting devices according to the related art is formed in a structure in which a nitride semiconductor layer is formed on a substrate, and two electrode layers are arranged on the nitride semiconductor layer.

Meanwhile, the lateral-type light emitting device according to the related art has a big loss caused at the active layer since mesa etching is performed with respect to a wide area. Accordingly, in order to compensate for the loss, various attempts are performed to ensure a wider active layer.

For example, according to the related art, an attempt to ensure a wider active layer is performed based on the electrical connection with the nitride semiconductor layer via a through electrode serving as a portion of an electrode layer. However, the related art has a problem in reliability since operating voltage VF is increased, and the improvement of the problem is required.

In addition, according to the related art, the light extraction efficiency may be degraded due to the light absorption of the electrode layer.

BRIEF DESCRIPTION OF THE DRAWINGS

The embodiments will be described in detail with reference to the following drawings in which like reference numerals refer to like elements wherein.

DETAILED DESCRIPTION

Hereinafter, a light emitting device, a light emitting device package, and a lighting system according to embodiments will be described with reference to accompanying drawings. As broadly described and embodied herein, provided are a light emitting device capable of improving reliability, a method of fabricating the same, a light emitting device package, and a lighting system. The light emitting device as disclosed herein provides improved light extraction efficiency, among other advantages.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Figure 1:
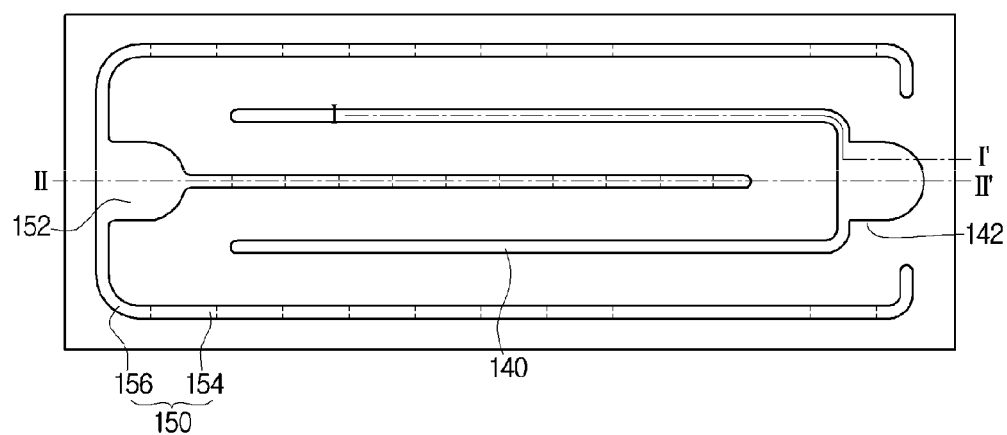
FIG. 1 is a top view showing a light emitting device according to the embodiment.
Figure 2A:
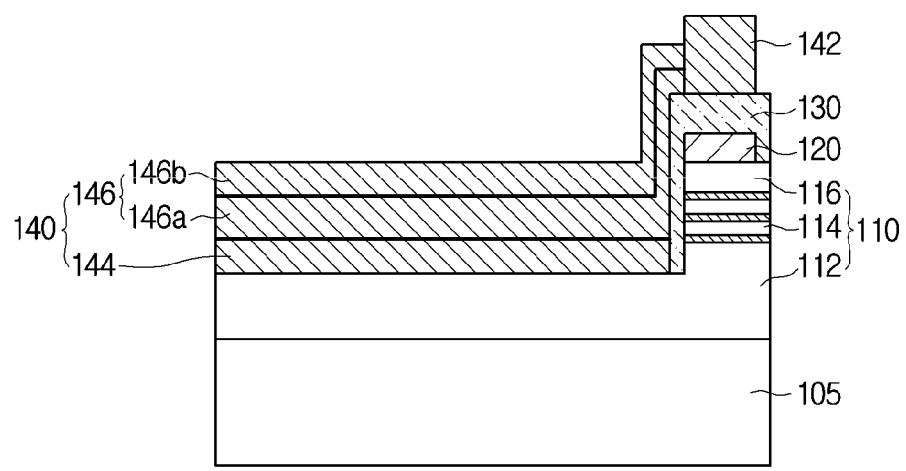
FIG. 2A is a first sectional view showing a light emitting device according to a first embodiment.
Figure 3:
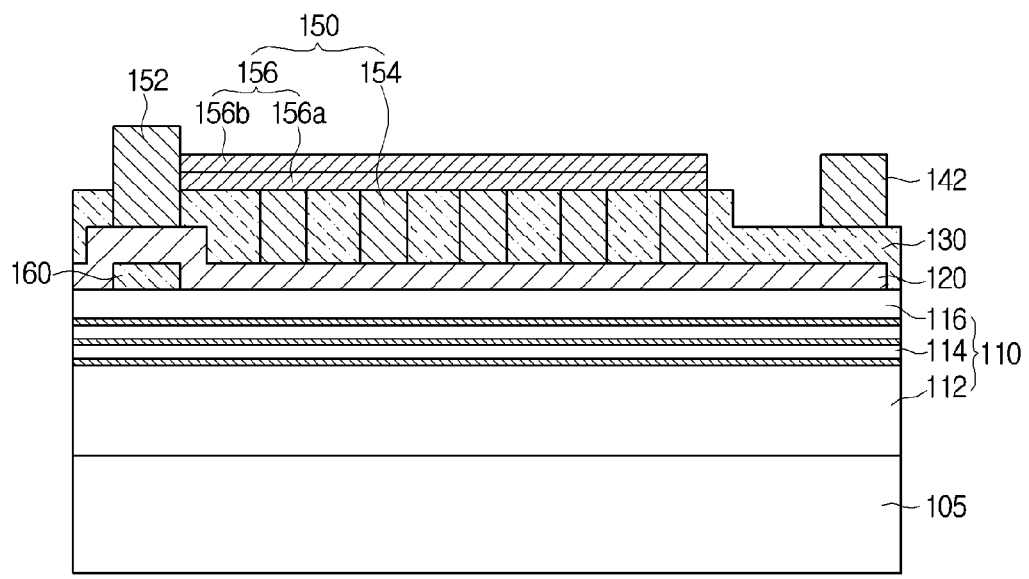
FIG. 3 is a second sectional view showing a light emitting device according to the first embodiment.

FIG. 1 is a top view showing a light emitting device 100, FIG. 2A is a first sectional view taken along line I-I' of the light emitting device 100 according to a first embodiment, and FIG. 3 is a sectional view taken along line II-II' of the light emitting device according to the second embodiment.

The light emitting device 100 according to the embodiment may include a substrate 105, a first conductive semiconductor layer 112 on the substrate 105, an active layer 114 on the first conductive semiconductor layer 112, and a second conductive semiconductor layer 116 on the active layer 114.

In addition, according to the embodiment, the light emitting device 100 may include an ohmic layer 120 on the second conductive semiconductor layer 116, an insulating layer 130 on the ohmic layer 120, a first branch electrode 140 electrically connected with the first conductive semiconductor layer 112, and a first pad electrode 142 connected with the first branch electrode 140 so that the first pad electrode 142 is electrically connected with the first conductive semiconductor layer 112.

In addition, according to the embodiment, the light emitting device 100 may include a second pad electrode 152 passing through the insulating layer 130 to make contact with the ohmic layer 120, a second branch electrode 150 connected with the second pad electrode 152 and provided on the insulating layer 130, and a second through electrode 154 passing through the insulating layer 130 to connect the second branch electrode 150 with the ohmic layer 120.

Although the embodiment is applicable to a lateral type light emitting device, the embodiment is not limited thereto.

Hereinafter, features of the light emitting device according to the embodiment will be described with reference to FIGS. 1, 2A, and 3.

According to the embodiment, the substrate 105 may include an insulating substrate or a conductive substrate. For example, the substrate 105 may include at least one of sapphire (Al2O3), SiC, Si, GaAs, GaN, ZnO, GaP, InP, Ge, and Ga2O3, or the combination thereof, but the embodiment is not limited thereto. A predetermined concave-convex structure (not shown) is formed on the substrate 105 to improve external light extraction efficiency, but the embodiment is not limited thereto.

According to the embodiment, a predetermined buffer layer (not shown) is formed on the substrate 105 to reduce lattice mismatch between a light emitting structure 110 and the substrate 105. The buffer layer may include at least one of GaN, InN, AlN, InGaN, AlGaN, InAlGaN, and AlInN, but the embodiment is not limited thereto.

According to the embodiment, the light emitting device 100 may include the light emitting structure 110 on the substrate 105 or the buffer layer. The light emitting structure 110 may include the first conductive semiconductor layer 112 on the substrate 105, the active layer 114 on the first conductive semiconductor layer 112, and the second conductive semiconductor layer 116 on the active layer 114.

The first conductive semiconductor layer 112 may be realized using a group III-V compound semiconductor doped with first conductive dopants. For example, when the first conductive semiconductor layer 112 is an N type semiconductor layer, the first conductive dopants may include Si, Ge, Sn, Se, and Te serving as N type dopants, but the embodiment is not limited thereto.

The first conductive semiconductor 112 may include a semiconductor material having a composition formula of $In_xAl_yGa_{1-x-y}N$ ($0 \le x \le 1$, $0 \le y \le 1$, $0 \le x+y \le 1$).

For example, the first conductive semiconductor layer 112 may include at least one of GaN, InN, AlN, InGaN, AlGaN, InAlGaN, AlInN, AlGaAs, InGaAs, AlInGaAs, GaP, AlGaP, InGaP, AlInGaP, and InP.

In the active layer 114, electrons injected through the first conductive semiconductor layer 112 and holes injected through the second conductive semiconductor layer 116 thereafter meet each other, so that light having energy determined by the inherent energy band of a material constituting the active layer (light emission layer) is emitted.

The active layer 114 may include at least one of a single quantum well, a multi-quantum well (MQW), a quantum-wire structure, and a quantum dot structure.

A well layer/barrier layer of the active layer 114 may be formed in a pair structure having at least one of InGaN/GaN, InGaN/InGaN, GaN/AlGaN, InAlGaN/GaN, GaAs(In-GaAs)/AlGaAs, and GaP(InGaP)/AlGaP, but the embodiment is not limited thereto. The well layer may include a material having a bandgap lower than that of the barrier layer.

According to the embodiment, an electron blocking layer is formed on the active layer 114 to perform an electron blocking function and an MQW cladding function of the active layer 114, so that the light emission efficiency can be improved.

For example, the electron blocking layer may include a semiconductor based on $Al_xIn_yGa_{(1-x-y)}N$ ($0 \le x \le 1$, $0 \le y \le 1$), and may have the energy bandgap higher than that of the active layer 114.

The electron blocking layer is implanted with P type ions to effectively block overflowed electrons, so that hole injection efficiency can be increased.

According to the embodiment, the second conductive semiconductor layer 116 may include a group III-V compound semiconductor layer doped with second conductive dopants. For example, the second conductive semiconductor layer 116 may include a semiconductor material having a composition formula of $In_xAl_yGa_{1-x-y}N$ ($0 \le x \le 1$, $0 \le y \le 1$, $0 \le x+y \le 1$). When the second conductive semiconductor layer 116 includes a P type semiconductor layer, the second conductive dopant may include Mg, Zn, Ca, Sr, or Ba serving as the second conductive dopant.

As shown in FIGS. 2A and 3, according to the embodiment, the light emitting device 100 may include the ohmic layer 120 on the first conductive semiconductor layer 112, the insulating layer 130 on the ohmic layer 120, the first branch electrode 140 electrically connected with the first conductive semiconductor layer 112, and the first pad electrode 142 connected with the first branch electrode 140 so that the first pad electrode 142 is electrically connected with the first conductive semiconductor layer 112.

The ohmic layer 120 may be formed by stacking single metal, a metal alloy, and a metallic oxide in a multiple structure so that carriers can be efficiently implanted. The ohmic layer 120 includes a transmissive electrode to improve light emission efficiency and to lower operating voltage, so that reliability can be improved.

For example, the ohmic layer 120 may include at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, or the combination thereof, but the embodiment is not limited thereto.

The insulating layer 130 may include an electrical insulator including an oxide or a nitride, but the embodiment is not limited thereto. The insulating layer 130 includes a transmissive insulating material to increase the light emission efficiency.

According to the embodiment, the active layer 114 is not mesa-etched at the position in which the first pad electrode 142 is formed, thereby ensuring an active layer region to improve internal light emission efficiency, and to improve light efficiency due to current spreading.

Therefore, according to the embodiment, the first pad electrode 142 is provided on the insulating layer 130, so that the first pad electrode 142 may be connected with the first branch electrode 140. The first pad electrode 142 may be vertically overlapped with the insulating layer 130 and the ohmic layer 120. The ohmic layer 120 is provided under the first pad electrode 142 while interposing the insulating layer 130 between the ohmic layer 120 and the first pad electrode 142, thereby widening a light emission area to improve carrier injection efficiency, so that light efficiency can be increased.

According to the embodiment, as shown in FIG. 2A, the first branch electrode 140 may be connected with the first conductive semiconductor layer 112 exposed by partially removing the ohmic layer 120, the second conductive semiconductor layer 116, and the active layer 114 through the mesa-etching process. In this case, the insulating layer 130 is interposed between the light emitting structure exposed through the etching process and the first branch electrode 140 to prevent electrical short.

According to the embodiment, an N type branch electrode structure sufficiently ensures a contact area with an N type semiconductor layer to prevent the increase of the operating voltage so that the reliability of the device can be improved. The P type branch electrode employs a point contact structure to contribute to current spreading. The second conductive semiconductor layer 116 makes contact with the ohmic layer 120 to prevent the increase of the operating voltage, so that the reliability and the light emission efficiency of the device can be maximized.

For example, as shown in FIG. 1, according to the structure of the first embodiment, when the N type branch electrode structure sufficiently ensures the contact area with the N type semiconductor layer and the P type branch electrode employs the point contact structure, the intensity of light (Po) and a wall-plug efficiency (ΔWPE) may be meaningfully increased as shown following table 1.

TABLE 1

| Items | P-contact relative ratio | N-contact relative ratio | Active area relative ratio | Intensity of light (Po) | ΔWPE |
|---|---|---|---|---|---|
| Comparative example | 100% | 100% | 100% | 96.96 | 100.00% |
| Embodiment example | 25.6% | 43.9% | 102.2% | 98.44 | 101.35% |

According to the embodiment, the first branch electrode 140 may include a first ohmic branch electrode 144 making contact with the first conductive semiconductor layer 112 and a first reflective branch electrode 146 provided on the first ohmic branch electrode 144.

According to the embodiment, the branch electrode making contact with the first conductive semiconductor layer 112 employs the first ohmic branch electrode 144 to ensure the ohmic characteristic with the first conductive semiconductor layer 112 as much as possible to reduce the operating voltage, so that the electrical reliability can be increased.

For example, the first ohmic branch electrode 144 may include at least one of Cr, Ni, Ti, Rh, Pd, Ir, Ru, Pt, Au, and Hf, or the combination thereof, but the embodiment is not limited thereto.

In addition, according to the embodiment, the first reflective branch electrode 146 is provided at an upper portion of the first ohmic branch electrode 144 which does not make contact with the first conductive semiconductor layer 112 to minimize light absorption by the branch electrode, so that external light extraction efficiency may be increased.

For example, the first reflective branch electrode 146 may include a plurality of layers. For example, the first reflective branch electrode 146 may include a lower first reflective branch electrode 146a and an upper first reflective branch electrode 146b, but the embodiment is not limited thereto.

The first reflective branch electrode 146 may include at least one of Ag, Al, Ni, Ti, Rh, Pd, Ir, Ru, Mg, Zn, Pt, Au, and Hf, or the combination thereof, but the embodiment is not limited thereto.

For example, if the first reflective branch electrode 146 is formed of two layers, the first reflective branch electrode 146 may include Al/Ni or Ag/Ni. If the first reflective branch electrode 146 is formed of one layer, the first reflective branch electrode 146 may include a distributed bragg reflector (DBR), but the embodiment is not limited thereto.

Figure 2B:
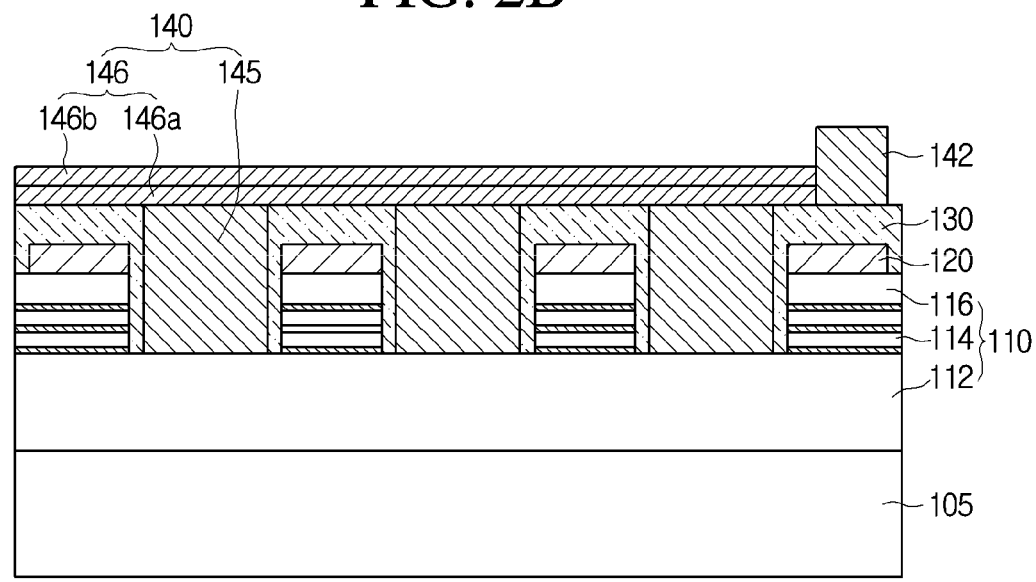
FIG. 2B is a sectional view showing a light emitting device according to another embodiment.

FIG. 2B is a sectional view showing a light emitting device according to another embodiment.

Differently from FIG. 2A, a point contact structure may be possible in the first branch electrode 140 in FIG. 2B. For example, as shown in FIG. 2B, the first branch electrode 140 may include a first through electrode 145 making contact with the first conductive semiconductor layer 112 and a first reflective branch electrode 146 provided on the first through electrode 145.

According to the embodiment, the first through electrode 145 of the first branch electrode making contact with the first conductive semiconductor layer 112 employs an ohmic material, thereby ensuring an ohmic characteristic with the first conductive semiconductor layer 112 as much as possible to reduce operating voltage, so that the electrical reliability can be increased.

The first reflective branch electrode 146 may include a plurality of layers. For example, the first reflective branch electrode 146 may include the lower first reflective branch electrode 146a and the upper first reflective branch electrode 146b, but the embodiment is not limited thereto.

According to the embodiment, when the point contact structure is employed in the first branch electrode 140, the first branch electrode 140 may include the first through electrode 145 making contact with the first conductive semiconductor layer 112. The contact ratio between the first through electrode 145 and the first conductive semiconductor layer 112 may be in the range of about 17% to about 44%.

For example, detailed embodiments according to the contact ratio between the first through electrode 145 and the first conductive semiconductor layer 112 are shown in Table 2, and have the meaning increase in the intensity of light (Po) and a wall-plug efficiency (ΔWPE) as compared with a comparative example.

TABLE 2

| Items | P-contact relative ratio | N-contact relative ratio | Active area relative ratio | Intensity of light (Po) | ΔWPE |
|---|---|---|---|---|---|
| Comparative example | 97.9% | 99.4% | 100% | 96.77 | 100% |
| Embodiment A | 25.6% | 43.9% | 102.2% | 98.44 | 101.35% |
| Embodiment B | 25.6% | 32.1% | 103.3% | 98.72 | 101.35% |
| Embodiment C | 25.6% | 21.9% | 104.4% | 98.46 | 101.15% |
| Embodiment D | 25.6% | 17.4% | 104.3% | 98.78 | 101.15% |

According to the embodiments, the contact ratio between the first through electrode 145 and the first conductive semiconductor layer 112 may be in the range of about 17% to about 44%.

For example, according to embodiment A, the first through electrode 145 may have one bar structure instead of the point contact structure in the branch electrode shown in FIG. 1. The first pad electrode 142 is provided on the insulating layer 130 so that the first pad electrode 142 may not make contact with the first conductive semiconductor layer 112. According to embodiment A, the intensity of light (Po) and a wall-plug efficiency (ΔWPE) are meaningfully increased due to the systematical coupling with the p-point contact structure.

In addition, according to embodiment B, the first through electrode 145 employs a point contact structure. One N type branch electrode may have a two-bar structure. The first pad electrode 142 is provided on the insulating layer 130, so that the first pad electrode 142 may not make contact with the first conductive semiconductor layer 112. FIG. 2B shows the first through electrode 145 having a three-bar structure in one N type branch electrode, in relation to the point contact structure of the first through electrode 145.

In even embodiment B, the intensity of light (Po) and the wall-plug efficiency (ΔWPE) are meaningfully increased due to the systematical coupling with the p-point contact structure.

In addition, according to embodiment C, the first through electrode 145 employs a point contact structure, and a four-bar structure may be provided in one N type branch electrode. The first pad electrode 142 is provided on the insulating layer 130, so that the first pad electrode 142 may not make contact with the first conductive semiconductor layer 112. In even embodiment C, the intensity of light (Po) and the wall-plug efficiency (ΔWPE) are meaningfully increased due to the systematical coupling with the p-point contact structure.

In addition, according to embodiment D, the first through electrode 145 employs a point contact structure, and a five-bar structure may be provided in one N type branch electrode. The first pad electrode 142 is provided on the insulating layer 130, so that the first pad electrode 142 may not make contact with the first conductive semiconductor layer 112. In even embodiment D, the intensity of light (Po) and the wall-plug efficiency (ΔWPE) are meaningfully increased due to the systematical coupling with the p-point contact structure.

According to the embodiment, the contact ratio between the second through electrode 154 and the ohmic layer 120 may be in the range of about 25% to about 34%, but the embodiment is not limited thereto.

As shown in FIG. 3, according to the embedment, the light emitting device may include a second pad electrode 152 passing through the insulating layer 130 to make contact with the ohmic layer 120, a second branch electrode 150 connected with the second pad electrode 152 and provided on the insulating layer 130, and a second through electrode 154 passing through the insulating layer 130 to connect the second branch electrode 150 with the ohmic layer 120.

According to the embodiment, although the through electrode is shown as a component of the branch electrode, the embodiment is not limited thereto.

The second through electrode 154 may be a second ohmic through electrode, and the second branch electrode 150 may be a second reflective branch electrode 156.

For example, the second through electrode 154 may include at least one of Cr, Ni, Ti, Rh, Pd, Ir, Ru, Pt, Au, and Hf or the combination thereof, but the embodiment is not limited thereto.

For example, the second reflective branch electrode 156 may include a plurality of layers. For example, the second reflective branch electrode 156 may include the lower second reflective branch electrode 156a and the upper second reflective branch electrode 156b, but the embodiment is not limited thereto.

The second reflective branch electrode 156 may include at least one of Ag, Al, Ni, Ti, Rh, Pd, Ir, Ru, Mg, Zn, Pt, Au, and Hf or the combination thereof, but the embodiment is not limited thereto.

For example, if the second reflective branch electrode 156 is formed at two layers, the second reflective branch electrode 156 may include Al/Ni or Ag/Ni. If the second reflective branch electrode 156 is formed at one layer, the second reflective branch electrode 156 may include a distributed bragg reflector (DBR), but the embodiment is not limited thereto.

According to the embodiment, a current spreading layer 160 is provided on the second conductive semiconductor layer 116 so that the current spreading layer 160 is overlapped with the second pad electrode 152, thereby increasing current spreading, so that the whole light emission efficiency can be increased.

For example, the current spreading layer 160 may include a non-conductive region, a first conductive type ion implantation layer, an insulating material, or an amorphous region, but the embodiment is not limited thereto.

Figure 4:
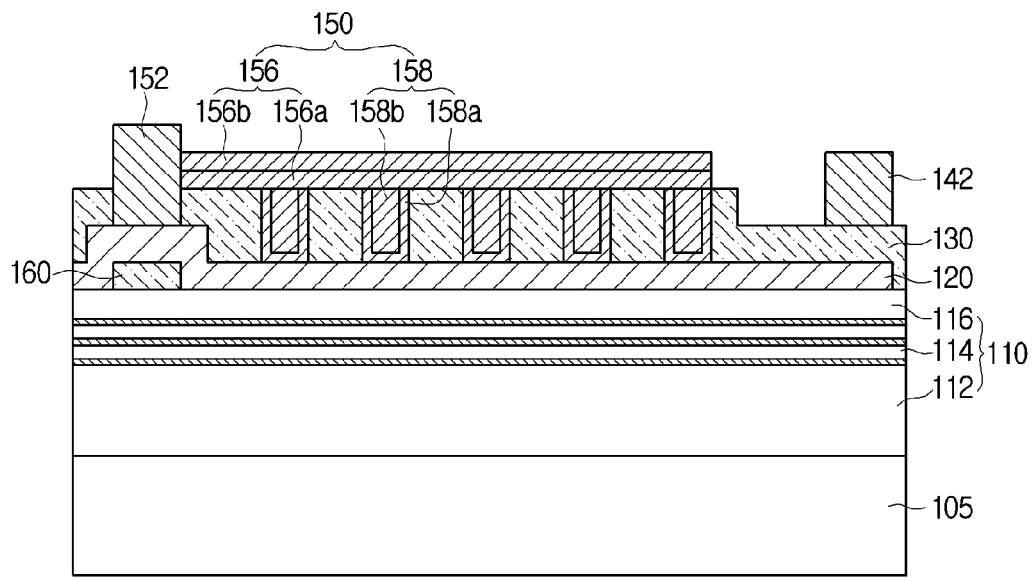
FIG. 4 is a second sectional view showing a light emitting device according to a second embodiment.

FIG. 4 is a sectional view showing a light emitting device according to the second embodiment.

The second embodiment may employ the technical features of the first embodiment.

According to the second embodiment, the second branch electrode 150 may include the second reflective branch electrode 156 and a third reflective through electrode 158.

The third reflective through electrode 158 may include a plurality of layers. For example, the third reflective through electrode 158 may include an outer third reflective through electrode 158a and an inner third reflective through electrode 158b, but the embodiment is not limited thereto.

According to the second embodiment, the third through electrode includes a reflective electrode material to minimize the light absorption by the branch electrode, and the ohmic layer 120 makes contact with the light emitting structure to ensure the ohmic characteristic so that the reliability can be maintained and the external light extraction efficiency can be maximized.

Figure 5:
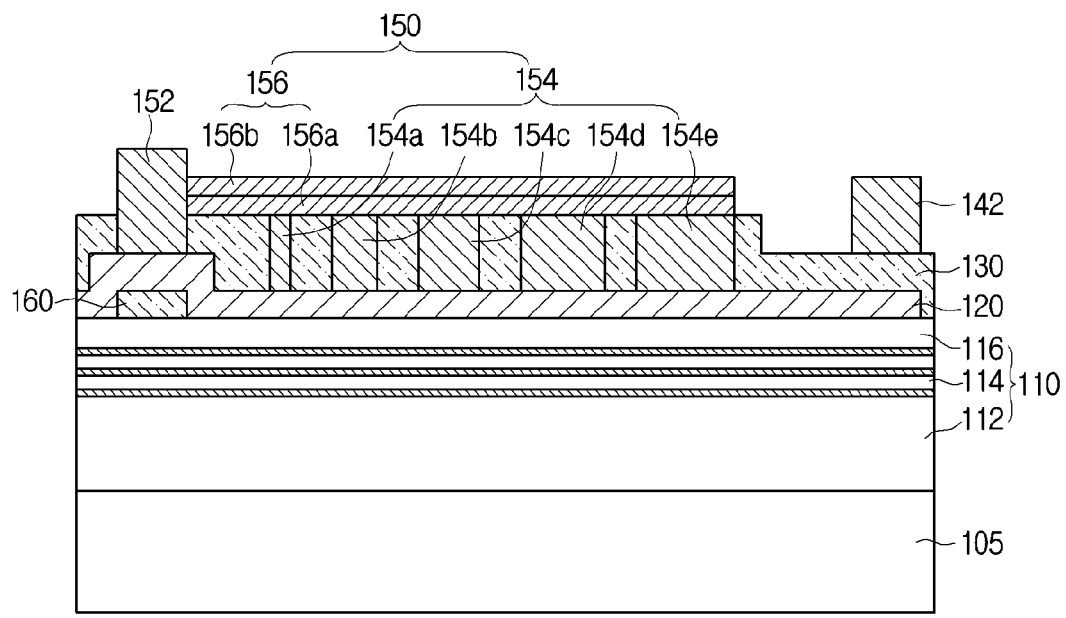
FIG. 5 is a second sectional view showing a light emitting device according to a third embodiment.

FIG. 5 is a sectional view showing a light emitting device according to a third embodiment.

The third embodiment may employ the technical features of the first embodiment or the second embodiment.

According to the third embodiment, a plurality of second through electrodes 154 may be provided. The second through electrodes 154 may have mutually different contact areas with the ohmic layer 120. Accordingly, at least two second through electrodes 154 may have mutually different contact areas with the ohmic contact layer 120.

For example, the contact area of the second through electrode 154 with the ohmic layer 120 is increased as the second through electrode 154 is farther away from the second pad electrode 152 to contribute to the current spreading, so that the light emission efficiency can be increased.

For example, the second through electrode 154 includes second through electrodes 154a, 154b, 154c, 154d, and 154e having contact areas with the ohmic layer 120, which are increased as the second through electrode 154 is farther away from the second pad electrode 152, to contribute to the current spreading, so that the light emission efficiency can be increased.

Meanwhile, the contact area of the second through electrode 154 with the ohmic layer 120 may be decreased as the second through electrode 154 is farther away from the second pad electrode 152.

In addition, the contact area of the second through electrode 154 with the ohmic layer 120 may be randomly varied as the second through electrode 154 is farther away from the second pad electrode 152.

According to the embodiment, a horizontal width of a contact region of the second through electrodes 154a, 154b, 154c, 154d, and 154e with the ohmic layer 120 may be in the range of about 20 μm to about 60 μm, but the embodiment is not limited thereto.

According to the embodiment, the contact area of the second through electrode 154a, which is closest to the second pad electrode 152, with the ohmic layer 120 has a first horizontal width ranging from about ½ to about ¼ of a second horizontal width of the contact area of the second through electrode 154e, which is most widely spaced apart from the second pad electrode 152, with the ohmic layer 120.

For example, according to the embodiment, the contact area of the second through electrode 154a, which is closest to the second pad electrode 152, with the ohmic layer 120 has the first horizontal width corresponding to about 1/3 of the second horizontal width of the contact area of the second through electrode 154e, which is most widely spaced apart from the second pad electrode 152, with the ohmic layer 120.

For example, the contact area of the second through electrode 154a, which is closest to the second pad electrode 152, with the ohmic layer 120 has a horizontal width of about 20 μm. The second horizontal width of the contact area of the second through electrode 154e, which is most widely spaced apart from the second pad electrode 152, with the ohmic layer 120 may be about 60 μm.

According to the embodiment, although the contact area of the second through electrode 154 with the ohmic layer 120 is varied as the second through electrode 154 is farther away from the second pad electrode 152, the through electrodes 154a, 154b, 154c, 154d, and 154e are arranged at a uniform interval to contribute to the uniform current spreading.

According to the embodiment, the shape of the second through electrode 154 to make contact with the ohmic layer 120 may be various shapes including a polygonal shape such as a bar shape, a square shape, or a rectangular shape, a circular shape, or an oval shape.

In addition, according to the embodiment, although the vertical sectional shape of the second through electrode 154 may be a rectangular shape, the embodiment is not limited thereto. The second through electrode 154 may have an upper width wider than a lower width, that is, a width narrowed to the lower portion. In addition, the second through electrode 154 may have the upper width narrower than the lower width, that is, a width widened to the lower portion.

Meanwhile, as shown in FIG. 1, although a horizontal sectional width of the second through electrode 154 is equal to the horizontal sectional width of the second reflective branch electrode 156, the embodiment is not limited thereto. For example, the horizontal sectional width of the second through electrode 154 may be greater than or less than the horizontal sectional width of the second reflective branch electrode 156.

Figure 6:
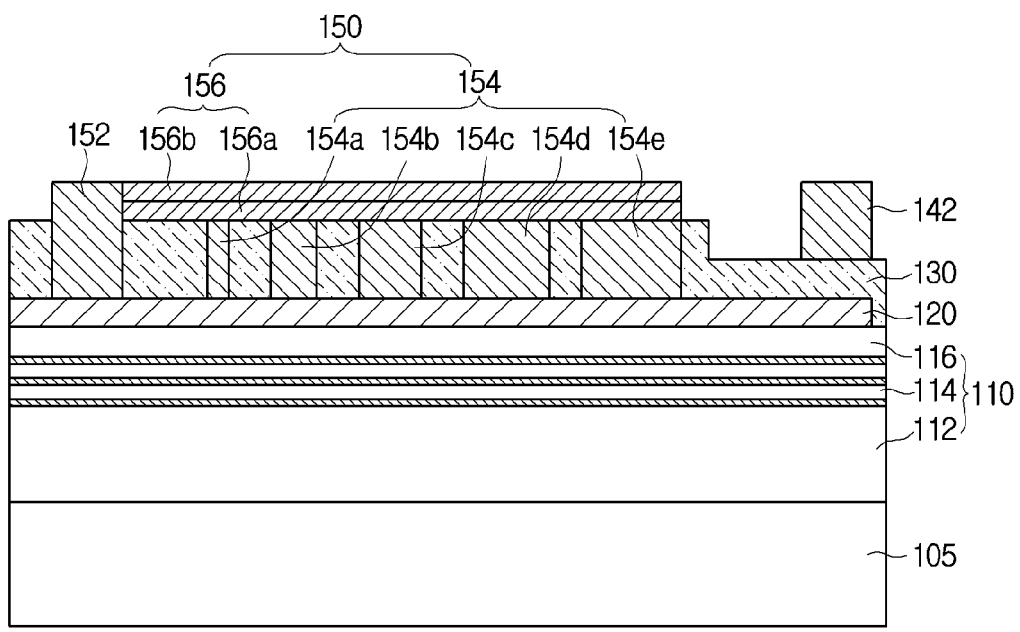
FIG. 6 is a second sectional view showing a light emitting device according to a fourth embodiment.

FIG. 6 is a sectional view showing a light emitting device according to a fourth embodiment.

The fourth embodiment may employ the technical features of the first embodiment to the third embodiment.

According to the fourth embodiment, a region of the ohmic layer 120, which is vertically overlapped with the second pad electrode 152, may make contact with the second conductive semiconductor layer 116.

For example, according to the fourth embodiment, a current spreading layer is not provided on the second conductive semiconductor layer 116 overlapped with the second pad electrode 152, so that the ohmic layer 120 may make contact with the second conductive semiconductor layer 116.

According to the fourth embodiment, as the ohmic layer 120 vertically overlapped with the second pad electrode 152 makes contact with the second conductive semiconductor layer 116, the light emission characteristic can be maintained or enhanced, thereby more improving the problem related to the increase of the operating voltage, which is a disadvantage of a point contact, as compared with the related art.

The embodiment can provide a light emitting device capable of improving reliability by contributing to the increase in the current spreading and the decrease in the operating voltage as the second conductive semiconductor layer makes contact with the ohmic layer, and the ohmic layer makes contact with the through electrode, a method of fabricating the same, a light emitting device package, and a lighting system.

In addition, according to the embodiment, a portion of the branch electrode making contact with the semiconductor layer is formed of a material representing a superior ohmic characteristic, and a remaining portion of the branch electrode includes a material representing superior reflectivity, so that the reliability can be maintained, and the light extraction efficiency can be maximized.

In addition, according to the embodiment, the contact between the lower end of the pad electrode and the semiconductor layer is controlled, so that the whole light emission efficiency of a chip can be improved due to the current spreading, thereby improving the light efficiency.

The light emitting device according to the embodiment is applicable to a display apparatus such as a portable terminal and a laptop computer, or variously applicable to a lighting device and an indication device.

In addition, the light emitting device according to the embodiment is applicable to a lamp of a vehicle, a streetlamp, an electric board, and a headlamp.

Figure 7:
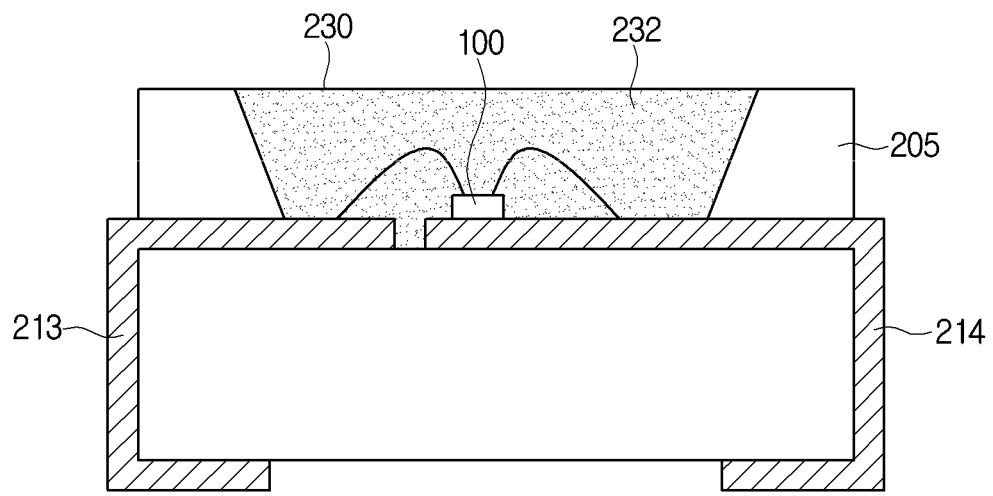
FIG. 7 is a sectional view showing a light emitting device package according to the embodiment.

FIG. 7 is a sectional view showing a light emitting device package in which the light emitting device according to the embodiments is mounted.

The light emitting device package according to the embodiment may include a package body part 205, third and fourth electrode layers 213 and 214 mounted on the package body part 205, a light emitting device 100 mounted on the package body part 205 and electrically connected with the third and fourth electrode layers 213 and 214, and a molding member 230 to surround the light emitting device 100.

The third and fourth electrode layers 213 and 214 are electrically isolated from each other to supply power to the light emitting device 100. In addition, the third and fourth electrode layers 213 and 214 reflect light emitted from the light emitting device 100 to increase light efficiency, and discharge heat emitted from the light emitting device 100 to the outside.

The light emitting device 100 may be electrically connected with the third electrode layer 213 and/or the fourth electrode layer 214 through one of a wire scheme, a flip-chip scheme, or a die-bonding scheme.

Figure 8:
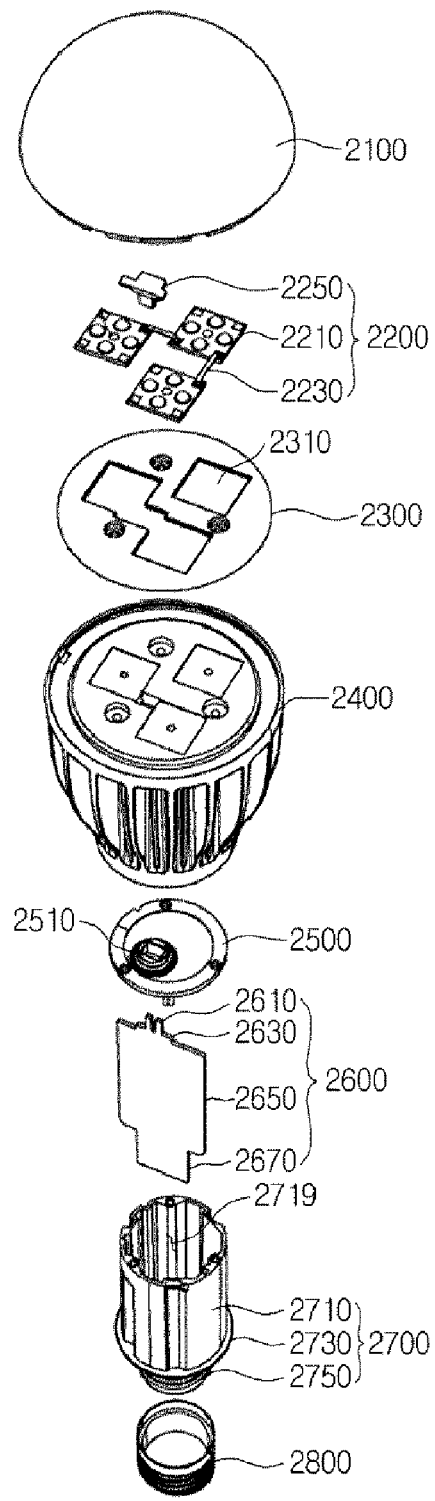
FIG. 8 is a perspective view showing a lighting system according to the embodiment.

FIG. 8 is an exploded perspective view showing a lighting system according to the embodiment.

The lighting system according to the embodiment may include a cover 2100, a light source module 2200, a radiator 2400, a power supply part 2600, an inner case 2700, and a socket 2800. The lighting system according to the embodiment may further include at least one of a member 2300 and a holder 2500. The light source module 2200 may include the light emitting device 100 or the light emitting device module 200 according to the embodiment.

The light source module 2200 may include a light source part 2210, a connection plate 2230, and a connector 2250. The member 2300 is provided at a top surface of the radiator 2400, and includes guide grooves 2310 into which a plurality of light sources 2210 and the connector 2250 are inserted.

The holder 2500 covers a receiving groove 2719 of an insulating part 2710 of the inner case 2700. Accordingly, the power supply part 2600 received in the receiving groove of the inner case 2700 is closed inside the inner case 2700 by the holder 2500. The holder 2500 has a guide protrusion part 2510.

The power supply part 2600 may include a protrusion 2610, a guide part 2630, a base 2650, and an extension part 2670. The inner case 2700 may include a molding part therein together with the power supply part 2600. The molding part is prepared by hardening molding liquid, and the power supply part 2600 may be fixed inside the inner case 2700 by the molding part.

As broadly described and embodied herein, provided are a light emitting device capable of improving reliability, a method of fabricating the same, a light emitting device package, and a lighting system.

The embodiments provide a light emitting device capable of improving light extraction efficiency, a method of fabricating the same, a light emitting device package, and a lighting system.

According to an embodiment, there is provided a light emitting device which may include a substrate, a first conductive semiconductor layer on the substrate, an active layer on the first conductive semiconductor layer, and a second conductive semiconductor layer on the active layer.

In addition, according to an embodiment, the light emitting device may include an ohmic layer on the second conductive semiconductor layer, an insulating layer on the ohmic layer, a first branch electrode electrically connected with the first conductive semiconductor layer, and a first pad electrode connected with the first branch electrode such that the first pad electrode is electrically connected with the first conductive semiconductor layer.

In addition, according to an embodiment, the light emitting device may include a second pad electrode passing through the insulating layer to make contact with the ohmic layer, a second branch electrode connected with the second pad electrode and provided on the insulating layer, and a second through electrode passing through the insulating layer to connect the second branch electrode with the ohmic layer.

According to an embodiment, there is provided a light emitting device which may include a substrate, a first conductive semiconductor layer on the substrate, an active layer on the first conductive semiconductor layer, a second conductive semiconductor layer on the active layer, an ohmic layer on the second conductive semiconductor layer, an insulating layer on the ohmic layer, a first electrode pad on the insulating layer, a first branch electrode extending from the first electrode pad and provided on the first conductive semiconductor layer, a second electrode pad passing through the insulating layer to make contact with the ohmic layer, and a second branch electrode to electrically connect the second electrode pad with the second conductive semiconductor layer. The second branch electrode may include a second reflective branch electrode extending from the second electrode pad and provided on the insulating layer and at least one second through electrode passing through the insulating layer to connect the second reflective branch electrode with the ohmic layer.

As described above, according to an embodiment, a light emitting device, capable of improving reliability by contributing to the increase in the current spreading and the decrease in the operating voltage as the second conductive semiconductor layer makes contact with the ohmic layer and the ohmic layer makes contact with the through electrode, a method of fabricating the same, a light emitting device package, and a lighting system can be provided.

In addition, according to an embodiment, a portion of the branch electrode making contact with the semiconductor layer may be formed of a material representing a superior ohmic characteristic, and a remaining portion of the branch electrode may include a material representing superior reflectivity, so that the reliability can be maintained, and the light extraction efficiency can be maximized.

In addition, according to one embodiment, the contact between the lower end of the pad electrode and the semiconductor layer may be controlled, so that the whole light emission efficiency of a chip can be improved due to the current spreading, thereby improving the light efficiency.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a substrate;
a first conductive semiconductor layer having an n-type semiconductor layer provided over the substrate;
an active layer provided over the first conductive semiconductor layer;
a second conductive semiconductor layer having a p-type semiconductor layer provided over the active layer;
an insulating layer provided over the second conductive semiconductor layer;
a first electrode electrically connected to the n-type semiconductor layer; and
a second electrode electrically connected to the p-type semiconductor layer,
wherein the first electrode includes a first pad and a first branch portion that extends laterally from the first pad,
wherein the second electrode includes a second pad, a second branch portion that extends laterally from the second pad, and a vertical portion that extends vertically from the second branch portion,
wherein the second pad vertically extends through the insulating layer to electrically connect to the second conductive semiconductor layer,
wherein the second branch portion extends over the insulating layer and the vertical portion vertically extends through the insulating layer to electrically connect the second electrode with the second semiconductor layer, wherein the first pad is spaced apart from the n-type semiconductor layer, and wherein the first branch portion is in contact with the n-type semiconductor layer, and wherein the first branch portion comprises an ohmic branch electrode in contact with a top surface of the n-type semiconductor layer and a reflective branch electrode on a top surface of the ohmic branch portion.

2. The light emitting device of claim 1, wherein an ohmic layer is provided between the p-type semiconductor layer and the insulating layer, the second electrode contacting the ohmic layer to electrically connect to the p-type semiconductor layer, and the ohmic layer is vertically overlapped by the first pad.

3. The light emitting device of claim 2, wherein the second pad vertically extends through the insulating layer to make contact with the ohmic layer, and wherein the vertical portion of the second electrode extends from the second branch portion through the insulating layer to make contact with the ohmic layer.

4. The light emitting device of claim 1, wherein the first branch portion of the first electrode and the second branch portion of the second electrode are laterally offset to not vertically overlap each other.

5. The light emitting device of claim 1, wherein the first pad is provided on a first end of the light emitting device and the second pad is provided on a second end of the light emitting device, the first and second ends being regions at opposite ends of the light emitting device, and
wherein the first branch portion extends in a first direction from the first end toward the second end and the second branch portion extends in the first direction from the second end toward the first end.

6. The light emitting device of claim 1, wherein the first pad is provided over the insulating layer such that the first pad is insulated from a portion of the first conductive type semiconductor directly under the first pad.

7. The light emitting device of claim 1, wherein the second electrode includes a plurality of the vertical portions, wherein at least two of the vertical portions have mutually different contact areas for electrically connecting to the second semiconductor layer.

8. The light emitting device of claim 7, wherein respective contact areas of the plurality of vertical portions increases with increasing distance from the second pad electrode.

9. The light emitting device of claim 1, wherein the first electrode includes a vertical portion that extends vertically from the first branch portion, wherein the vertical portion of the first electrode extends through the second conductive semiconductor layer and the active layer to electrically couple to the first conductive semiconductor layer.

10. The light emitting device of claim 2, wherein the first pad is vertically overlapped with the ohmic layer on the p-type semiconductor layer.

11. The light emitting device of claim 1, wherein the reflective branch electrode is spaced apart from the top surface of the n-type semiconductor layer, wherein the reflective branch electrode comprise at least one of Ag, Al, Ti, Rh, Pd, Mg, Zn, Pt, and Hf, or the combination thereof.

12. A light emitting device comprising:
a substrate having a length in a first direction, a width in a second direction, and a height in a third direction;
a first conductive semiconductor layer having a n-type semiconductor layer provided over the substrate;
an active layer provided over the first conductive semiconductor layer;
a second conductive semiconductor layer having a p-type semiconductor layer provided over the active layer;
an insulating layer provided over the second conductive semiconductor layer;
a first electrode electrically connected to the n-type semiconductor layer;
a second electrode electrically connected to the p-type semiconductor layer,
wherein the first electrode includes a first pad and a first branch portion that extends from the first pad,
wherein the second electrode includes a second pad and a second branch portion that extends from the second pad,
wherein the first pad is provided at a first end of the light emitting device and the second pad is provided at a second end of the light emitting device opposite the first end, and
wherein the first branch portion extends from the first pad in the first direction and the second branch portion extends from the second pad opposite the first branch portion, the first and second branch portion being parallel to each other,
wherein the first pad is spaced apart from the n-type semiconductor layer, and wherein the first branch portion is in contact with the n-type semiconductor layer,
wherein the first branch portion comprises an ohmic branch electrode in contact with a top surface of the n-type semiconductor layer and a reflective branch electrode on a top surface of the ohmic branch portion.

13. The light emitting device of claim 12, wherein the first branch portion and the second branch portion are spaced a prescribed distance from each other in the second direction such that the first and second branch portions do not vertically overlap each other.

14. The light emitting device of claim 13, wherein the first branch portion and the second branch portion laterally overlap in the second direction.

15. The light emitting device of claim 14, wherein the first electrode includes at least one first vertical portion that extends from the first branch portion in the third direction, and the second electrode includes at least one second vertical portion that extends from the second branch portion in the third direction,
wherein the first vertical portion electrically connects to the first conductive semiconductor layer and the second vertical portion electrically connects to the second conductive semiconductor layer.

16. The light emitting device of claim 15, wherein the second electrode includes a plurality of the second vertical portions each having a prescribed width.

17. The light emitting device of claim 16, wherein the prescribed widths of the plurality of second vertical portions increase with increasing distance from the second pad in the first direction.

18. The light emitting device of claim 13, wherein the first branch portion is provided at a first prescribed height and the second branch portion is provided at a second prescribed height that is higher than the first prescribed height in the third direction.

19. The light emitting device of claim 18, wherein the first branch portion is provided directly on the first conductive semiconductor layer.

20. The light emitting device of claim 12, wherein the reflective branch electrode is not vertically overlapped with the active layer, wherein the reflective branch electrode comprises Al/Ni or Ag/Ni.

* * * * *